(12) United States Patent
Amla et al.

(10) Patent No.: US 11,116,078 B2
(45) Date of Patent: Sep. 7, 2021

(54) PREPREGS AND LAMINATES HAVING HOMOGENEOUS DIELECTRIC PROPERTIES

(71) Applicant: Isola USA Corp., Chandler, AZ (US)

(72) Inventors: Tarun Amla, Chandler, AZ (US); Johann R. Schumacher, Gilbert, AZ (US); Sascha Kreuer, Aachen (DE); Peggy Conn, Chandler, AZ (US); Stanley E. Wilson, Chandler, AZ (US)

(*) Notice: Subject to any disclaimer, the term of this patent is extended or adjusted under 35 U.S.C. 154(b) by 0 days.

(21) Appl. No.: 16/808,068

(22) Filed: Mar. 3, 2020

(65) Prior Publication Data

US 2020/0315007 A1 Oct. 1, 2020

Related U.S. Application Data

(63) Continuation of application No. 16/056,131, filed on Aug. 6, 2018, now Pat. No. 10,582,614, which is a
(Continued)

(51) Int. Cl.
*H05K 1/03* (2006.01)
*C08J 5/24* (2006.01)
(Continued)

(52) U.S. Cl.
CPC .............. *H05K 1/0366* (2013.01); *C08J 5/24* (2013.01); *H01B 3/40* (2013.01); *C08J 2300/22* (2013.01);
(Continued)

(58) Field of Classification Search
CPC ...... C08J 5/24; C08J 2300/22; C08J 2300/24; H01B 3/40; H05K 1/024; H05K 1/0366;
(Continued)

(56) References Cited

U.S. PATENT DOCUMENTS

| 3,962,520 A | 6/1976 | Watanabe et al. |
| 6,048,807 A | 4/2000 | Landi |

(Continued)

FOREIGN PATENT DOCUMENTS

| EP | 2 241 589 | 10/2010 |
| JP | 61 285230 | 12/1986 |

(Continued)

OTHER PUBLICATIONS

Polymer Data Handbook, Poly(amide imide), CRC Press 1999, pp. 260-262.
(Continued)

*Primary Examiner* — Camie S Thompson
(74) *Attorney, Agent, or Firm* — McDonnell Boehnen Hulbert & Berghoff LLP

(57) ABSTRACT

Prepregs and laminates made from resin compositions having a free resin portion and a resin impregnated reinforcing material portion where the resin includes one or more base resins and one or more high Dk materials wherein the one or more high Dk materials are present in the resin composition in an amount sufficient to impart the resin composition with a cured $Dk_W$ that matches the $Dk_{WR}$ of a resin impregnated reinforcing material to which the resin composition is applied to within plus or minus (±) 15%.

20 Claims, 1 Drawing Sheet

Related U.S. Application Data continuation of application No. 14/512,815, filed on Oct. 13, 2014, now Pat. No. 10,070,518, and a continuation of application No. PCT/US2014/058824, filed on Oct. 2, 2014, and a continuation-in-part of application No. 13/803,698, filed on Mar. 14, 2013, now abandoned.

(60) Provisional application No. 61/761,669, filed on Feb. 6, 2013.

(51) Int. Cl.
    *H01B 3/40*     (2006.01)
    *H05K 1/02*     (2006.01)

(52) U.S. Cl.
    CPC ........... *C08J 2300/24* (2013.01); *H05K 1/024* (2013.01); *H05K 1/0248* (2013.01); *H05K 1/0373* (2013.01); *H05K 2201/0195* (2013.01); *Y10T 428/2481* (2015.01); *Y10T 428/24802* (2015.01); *Y10T 428/24893* (2015.01); *Y10T 428/24917* (2015.01); *Y10T 428/24926* (2015.01)

(58) Field of Classification Search
    CPC ......... H05K 1/0373; H05K 2201/0195; H05K 1/036; H05K 2201/029; B32B 5/12; B32B 27/38; B32B 27/381; B32B 17/00; B32B 17/1099; B32B 5/02; B32B 5/022; B32B 5/024; B32B 17/10; B32B 15/08; B32B 15/092; B32B 15/20; B32B 2262/101; B32B 2457/08; B32B 2307/204; B32B 7/14; C08K 3/36; C08K 7/14; C08L 63/00; C08L 71/126; C08L 79/04; C08L 2205/03; Y10T 428/2942; Y10T 428/249928; Y10T 428/2481; Y10T 428/24892; Y10T 428/24917; Y10T 442/2992

USPC ... 428/196, 195.1, 206, 209, 210, 90, 297.7, 428/297.4; 442/59, 180
See application file for complete search history.

(56) References Cited

U.S. PATENT DOCUMENTS

| | | | |
|---|---|---|---|
| 6,245,696 | B1 | 6/2001 | Haas et al. |
| 6,333,384 | B1 | 12/2001 | Lane et al. |
| 6,495,244 | B1 | 12/2002 | Andresakis et al. |
| 6,653,371 | B1 | 11/2003 | Burns et al. |
| 10,070,518 | B2 * | 9/2018 | Amla ...................... H01B 3/40 |
| 10,582,614 | B2 * | 3/2020 | Amla .......................... C08J 5/24 |
| 2002/0009577 | A1 | 1/2002 | Takaya et al. |

FOREIGN PATENT DOCUMENTS

| | | |
|---|---|---|
| JP | 2004-210936 | 7/2004 |
| JP | 2005-015652 | 1/2005 |
| JP | 2006-206689 | 8/2006 |
| TW | I298339 | 5/2003 |

OTHER PUBLICATIONS

Arion, Everything you ever wanted to know about Laminates ... but were afraid to ask, Nov. 2008, pp. 30-31.

McMorrow, The Impact of PCB Laminate Weave on the Electrical Performance of Differential Signaling at Multi-Gigabit Data Rates, DesignCon 2005, pp. 2, 8-11, 20.

Wang, Characteristics of Polyimide/barium Titanate Composite Films, Ceramics International 35 (2009) pp. 265-268.

Fujikawa, S., "Glass-fibre resin laminate for PCT—obtd. from prepreg sheets of barium titanate-contg. resin immersed in glass fabric", WPI/Thomson, vol. 1987, No. 4, Dec. 16, 1986, XP002725153, WPI Abstract.

* cited by examiner

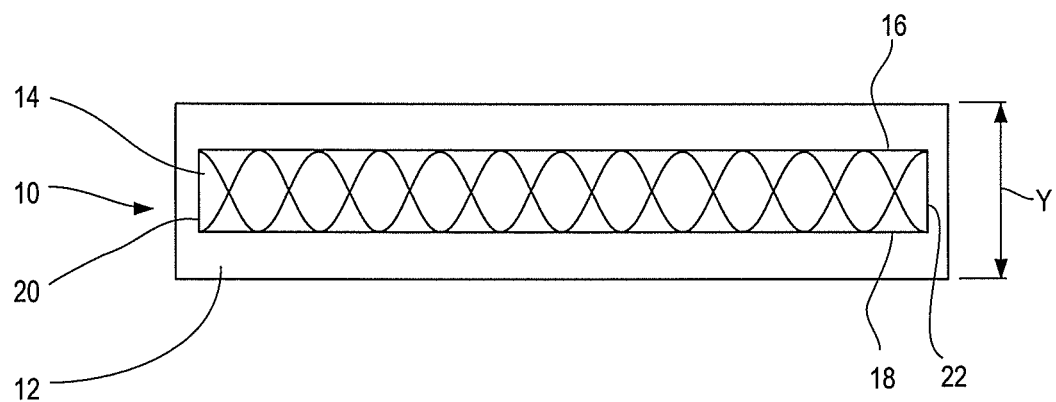

PREPREGS AND LAMINATES HAVING HOMOGENEOUS DIELECTRIC PROPERTIES

This is a continuation of U.S. patent application Ser. No. 16/056,131, filed Aug. 6, 2018, now U.S. Pat. No. 10,582,614, which is a continuation of U.S. patent application Ser. No. 14/512,815 filed on Oct. 13, 2014, now U.S. Pat. No. 10,070,518, which in turn is a continuation-in-part of U.S. patent application Ser. No. 13/803,698, filed on Mar. 14, 2013, now abandoned, which in turn claims priority to U.S. provisional application No. 61/761,669, filed on Feb. 6, 2013. The Ser. No. 14/512,815 application is also a continuation of PCT/US2014/58824 filed on Oct. 2, 2014. The specifications of every application noted above are incorporated herein by reference.

BACKGROUND OF THE INVENTION

(1) Field of the Invention

This invention relates to resin compositions that include one or more high Dk materials in along with a base resin wherein the high Dk material(s) has a dielectric constant is greater than the dielectric constant of the cured base resin. This invention also relates to prepregs and laminates having a homogeneous dielectric constant across the prepreg or laminate cross sections that are made with the inventive resin compositions.

(2) Description of the Art

Prepregs and copper clad laminates are planar materials that are routinely used in the manufacture of printed circuit boards. Prepregs and laminates are typically composite structures that include a reinforcing material such as woven glass, non-woven glass, paper, or other fibrous and non-fibrous materials and a polymeric resin that is used as a matrix material—a material that is applied to or used to impregnate the reinforcing material With operating frequencies of electronic devices ever increasing, the dielectric properties of the prepregs and laminates are becoming more important to carefully control. One problem with current prepregs and laminates is that the dielectric properties of the reinforcing materials and the matrix materials are very different. When very high speed signals are transmitted through structures such as printed circuit boards built using such metal clad laminates, the signal experiences skew and a difference in speed as the signal propagates over anisotropic regions. This problem is further compounded when a different signal is run and in a worst-case scenario, the difference in propagation speed over long lines leads to major signal integrity problems and in some cases to total signal disappearance. This problem has become a major concern for electronic device designers especially with onboard frequencies moving to 14 GHz and beyond to transmit over 100 Gigabits/second over four channels in which the skew is expected to be a major design challenge.

SUMMARY OF THE INVENTION

The present invention is directed to prepregs and laminates that solve the skew problem by eliminating the gap between the dielectric constant of the matrix and the dielectric constant of the reinforcing material(s). Thus, one aspect of this invention are resin compositions comprising one or more base resins and one or more high Dk materials wherein the one or more high Dk materials are present in the resin composition in an amount sufficient to impart the resin composition with a cured Dk that matches the Dk of the reinforcing material to which the resin composition is applied to within plus or minus (±) 15%.

Another aspect of this invention are resin compositions comprising at least one base resin and from about 5 to about 60 wt % of particles of or more high Dk materials selected from the group consisting of strontium titanate, barium titanate, lead titanate, lead zirconate titanate, lead lanthanum zirconate titanate and combinations thereof wherein the Dk of the resin composition matches the Dk of a woven glass fabric reinforcing material to which the resin composition is applied to within plus or minus (±) 15%.

Still another aspect of this invention are prepregs comprising a reinforcing material having a $Dk_R$, and a resin composition including one or more base resins having a $Dk_W$ where $Dk_R$ is more than 15% greater than $Dk_W$ the resin composition further including one or more high Dk materials present in the resin composition in an amount sufficient to impart the resin composition with a cured $Dk_W$ that matches the $Dk_R$ of the reinforcing material to which the resin composition is applied to within plus or minus (±) 15%.

Yet another embodiment of this invention are prepregs comprising: an at least partially cured resin impregnated reinforcing material portion; and a free resin portion wherein the resin includes at least one high dielectric constant material, the free resin portion having a dielectric constant $DK_W$ and the resin impregnated reinforcing material portion having a dielectric constant $DK_{WR}$ wherein the high dielectric constant material is incorporated into the resin in an amount sufficient to match the $DK_{WR}$ with the $DK_W$ such that the $DK_{WR}$ and $DK_W$ differ by no more than (±) 15%.

DESCRIPTION OF THE FIGURES

FIG. 1 is a cross-section of a prepreg or laminate embodiment of this invention that includes a homogeneous dielectric constant across its cross section.

DESCRIPTION OF CURRENT EMBODIMENTS

This invention is directed generally to reinforced prepregs and laminates used in the electronics industry that include a resin or matrix component and a reinforcing component. The starting components used in the prepregs and laminates of this invention have dielectric constants that differ by more than 15%. In particular, the resin component has a $DK_W$ and the reinforcing component has a $DK_R$ and the $DK_W$ and the $DK_R$ differ by more than 15%. Indeed, it is common for the $DK_R$ and DK of the resin material without a high Dk material $(DK_O)$ to easily differ by more than 30%

The term "starting component dielectric constant" refers to the dielectric constant of each starting material before the starting materials are combined to form a resin impregnated reinforcing material and/or before they are incorporated into a reinforced prepreg and/or laminate.

In one embodiment of this invention, the resin component is modified with a high dielectric constant material to form a prepreg or laminate in which the matrix component dielectric constant and the reinforcing material dielectric constant are "homogeneous" or "match. The term "homogeneous" or "match" are used similarly herein to refer to two dielectric constants that differ from one another by no more than plus or minus (±) 15% and more preferably by no more than plus or minus (±) 5%.

Another embodiment of this invention are prepregs and laminates having matching or homogeneous dielectric constant across their cross section. With a prepreg or laminate, this means that the dielectric constant of a resin impregnated reinforcing material portion ($DK_{WR}$) of the prepreg or laminate matches the dielectric constant of a free resin portion ($DK_W$) of the prepreg or laminate. In this embodiment, the dielectric constant of the resin is matched with the dielectric constant of the resin impregnated reinforcing material to form a laminate with a matching dielectric constant across its cross section.

In the embodiments above, the dielectric constant of the reinforcing material(s) ($Dk_R$) is generally fixed. Moreover, the dielectric constant of the resin or matrix material without the high dielectric constant material ($Dk_O$) is generally significantly different, i.e., greater than ±15% different, from the dielectric constant of the reinforcing material ($Dk_R$). Therefore, this invention matches dielectric constants by incorporating one or more high dielectric constant (Dk) materials into the resin (also referred to as the matrix material) before associating matrix material with the reinforcing material.

Referring now to FIG. 1 there is shown a prepreg (10) of this invention having a cross section "Y". The prepreg includes a free resin portion (12) and a resin impregnated reinforcing material portion (14). The free resin portion has a $Dk_W$. The resin impregnated reinforcing material portion has a $Dk_{WR}$. The free resin portion of the prepreg or laminate includes any resin having a $Dk_W$ that can be determined independently of the $Dk_{WR}$. The term "free resin" refers to resin that is part of the prepreg or laminate but that is at least 1 micron from any reinforcement surface—top (16) bottom (18) or sides (20) and (22)—after the resin is incorporated into the resin impregnated reinforcing material portion. The free resin will generally be a b-staged or c-staged resin. This includes for example free resin that remains after a resin coated copper sheet is applied resin down to a core resin impregnated reinforcing material to form a copper coated prepreg or laminate.

The "dielectric constants" discussed herein and the dielectric constant ranges or numbers referred to herein are determined by the Bereskin test method or, in the alternative, by the split post method. Where a comparison of dielectric constants is discussed, then the compared dielectric constants are determined by the same test method. The dielectric constant of the resin is determined using a fully cured resin sample. The dielectric constant of the resin impregnated reinforcing material portion $Dk_{WR}$ is determined using a sample of a fully cured resin impregnated reinforcing material.

The reinforcing material may be any sheet or ground material(s) that are known to be useful in manufacturing substrate sheets for fabricating a prepregs or laminates used to manufacture printed circuit boards. While, as noted, ground materials such as ground glass fiber materials may be used, it is preferred that the reinforcing material is a sheet material. For example, the reinforcing sheet material may be inorganic fiber cloth including various glass cloth (e.g., roving cloth, cloth, a chopped mat, and a surfacing mat), metal fiber cloth, and the like; woven or unwoven cloth made of liquid crystal fiber (e.g., wholly aromatic polyamide fiber, wholly aromatic polyester fiber, and polybenzazole fiber); woven or unwoven cloth made of synthetic fiber (e.g., polyvinyl alcohol fiber, polyester fiber, and acrylic fiber); natural fiber cloth (e.g., cotton cloth, hemp cloth, and felt); carbon fiber cloth; and natural cellulosic cloth (e.g., craft paper, cotton paper, and paper-glass combined fiber paper).

In one aspect of the invention, the reinforcing material is a woven glass fabric material. Such woven glass fabric materials will have a $Dk_R$ of from about 3.5 to 7.0 or greater. Examples of such woven glass fabric materials include, for example, low Dk glass having a $Dk_R$ of from about 3.5 to about 4.5, E-glass; R-glass, ECR-glass, S-glass, C-glass, Q-glass and any other woven glass fabric of the kind known to be useful in preparing glass fabric reinforced prepregs and laminates.

The resin compositions of this invention will include one or more base resins that are known in the art to be useful in manufacturing prepreg and laminate materials. The base resin will typically be a thermoset or thermoplastic resin Examples of useful base resins include epoxy resins, polyphenylene ether based resins, cyanurate resins, bismaleimide resins, polyimide resins, phenolic resins, furan resins, xylene formaldehyde resins, ketone formaldehyde resins, urea resins, melamine resins, aniline resins, alkyd resins, unsaturated polyester resins, diallyl phthalate resins, triallyl cyanurate resins, triazine resins, polyurethane resins, silicone resins and any combination or mixture thereof.

In one aspect of this invention, the base resin is or includes an epoxy resin. Some examples of useful epoxy resins include phenol types such as those based on the diglycidyl ether of bisphenol A, on polyglycidyl ethers of phenol-formaldehyde novolac or cresol-formaldehyde novolac, on the triglycidyl ether of tris(p-hydroxyphenol) methane, or on the tetraglycidyl ether of tetraphenylethane; amine types such as those based on tetraglycidyl-methylenedianiline or on the triglycidyl ether of p-aminoglycol; cycloaliphatic types such as those based on 3,4-epoxycyclohexylmethyl-3,4-epoxycyclohexane carboxylate. The term "epoxy resin" also refers to reaction products of compounds containing an excess of epoxy (for instance, of the aforementioned types) and aromatic dihydroxy compounds. These compounds may be halogen-substituted. Preference is given to epoxy-resins which are derivative of bisphenol A, particularly FR-4. FR-4 is made by an advancing reaction of an excess of bisphenol A diglydicyl ether tetrabromobisphenol A. Mixtures of epoxy resins with bismaleimide resin, cyanate resin and/or bismaleimide triazine resin can also be applied.

The resin compositions, in addition to the base resin will typically include initiators or catalysts, one or more optional flame retardants and solvents. The flame retardant may be any flame retardant material that is known to be useful in resin compositions used to manufacture prepregs and laminates use to manufacture printed circuit boards. The flame retardant(s) may contain halogens or they may be halogen free. Alternatively or in addition, the resins may include halogens such as bromine to impart the cured resin with flame retardant properties.

The resin composition may also include polymerization initiators or catalysts. Examples of some useful initiators or catalysts include, but are not limited to peroxide or azo-type polymerization initiators (catalysts). In general, the initiators/catalysts chosen may be any compound that is known to be useful in resin synthesis or curing whether or not it performs one of these functions.

The resin composition will include one or more solvents which are typically used to solubilize the appropriate resin composition ingredients and/or to control resin viscosity and/or in order to maintain the resin ingredients in a suspended dispersion. Any solvent known by one of skill in the art to be useful in conjunction with thermosetting resin systems can be used. Particularly useful solvents include methylethylketone (MEK), toluene, dimethylformamide (DMF), or mixtures thereof. As noted below, the resin compositions are used to manufacture prepregs and laminates. During the manufacturing process, the reinforcing materials are impregnated with or otherwise associated with the resin compositions and some more most of the solvent is removed from the resin compositions to form the prepregs and laminates. Thus, when resin composition weight percent amounts are listed, they are reported on a dry-solvent free-basis unless otherwise noted.

The resin compositions may include a variety of other optional ingredients including fillers, tougheners, adhesion promoters, defoaming agents, leveling agents, dyes, and pigments. For example, a fluorescent dye can be added to the resin composition in a trace amount to cause a laminate prepared therefrom to fluoresce when exposed to UV light in a board shop's optical inspection equipment. Other optional ingredients known by persons of skill in the art to be useful in resins that are used to manufacture printed circuit board laminates may also be included in the resin compositions of this invention.

The resin compositions of this invention will also include one or more high Dk materials. The high Dk materials can be any materials that can be incorporated into a liquid resin such that the Dk of the cured or partially cured resin composition including the high Dk material is different from and preferably higher than the Dk of the resin composition resin ingredient(s). In one embodiment, the high Dk material will have a Dk of greater than about 200 and more preferably greater than about 500.

One class of useful high Dk materials are ferroelectric materials. Examples of some useful ferroelectric materials include strontium titanate, barium titanate, lead titanate, lead zirconate titanate, lead lanthanum zirconate titanate and combinations thereof. Particularly useful high DK materials are strontium titanate and barium titanate.

The high DK materials can be incorporated into the resin compositions as a particulate material. If a particular material is used, then the high DK material will typically have particle sizes ranging from about 1 nm to 40 microns.

The high DK material will be included in the resin composition in an amount sufficient to form a homogeneous prepreg or laminate. In one embodiment, a homogeneous prepreg or laminate will have a resin composition or matrix $Dk_W$ that is within ±15% of the reinforcing material $Dk_R$ and preferably within ±5%. In an alternative, embodiment, the homogeneous prepreg or laminate will have a free resin portion that has a $Dk_W$ that is within ±15% of the resin impregnated reinforcing material portion $Dk_{WR}$ and preferably within ±5%.

The amount of high DK material that is incorporated into the resin composition will vary depending upon the $DK_O$ of the base resin and a $DK_R$ of the reinforcing material. Generally, the greater the difference between the $Dk_O$ and $Dk_R$ the greater the amount of high Dk material that will be included in the resin composition. Generally, an amount of high Dk material that is greater than about 2 wt % of the resin composition on a dry basis is necessary to cause a change in the base resin Dk. The maximum amount of high Dk material that can be incorporated into the resin composition without significantly impacting resin composition properties is about 70 wt % on a dry, solvent free basis. In an alternate embodiment the high Dk material will be present in the resin composition in an amount ranging from about 5 to about 60 wt % on a dry basis. We have discovered that adding from about 5 to about 60 wt % of particulate barium titanate to a base resin having a $Dk_O$ of about 4 increases the DkW of the resin composition from just above 4 at a 5 wt % loading to higher than 7.5 at a 60 wt % loading.

The resin compositions described above are especially useful for preparing prepregs and/or laminates used in the manufacture of printed circuit boards. In order to be useful in manufacturing printed circuit boards the laminates can be partially cured or b-staged—to form what is known in the industry as a prepreg—in which state they can be laid up with additional material sheets to form a c-staged or fully cured laminate sheet. Alternatively, the resins can be manufactured into c-staged or fully cured material sheets.

In one useful processing system, the resin composition/reinforcing material combinations described above are useful for making prepregs in a batch or in a continuous process. Prepregs are generally manufactured using a core material such as a roll of woven glass web (fabric) which is unwound into a series of drive rolls. The web then passes into a coating area where the web is passed through a tank which contains the thermosetting resin system of this invention, solvent and other components where the glass web becomes saturated with the resin. The saturated glass web is then passed through a pair of metering rolls which remove excess resin from the saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll The woven glass web can replaced with a woven fabric material, paper, plastic sheets, felt, and/or particulate materials such as glass fiber particles or particulate materials.

In another process for manufacturing prepreg or laminate materials, thermosetting resins of this invention are pre-mixed in a mixing vessel under ambient temperature and pressure. The viscosity of the pre-mix is ~600-1000 cps and can be adjusted by adding or removing solvent from the resin. Fabric substrate—such as E glass—is pulled through a dip tank including the premixed resin, through an oven tower where excess solvent is driven off and the prepreg is rolled or sheeted to size, layed up between Cu foil in various constructions depending on glass weave style, resin content & thickness requirements.

The resin composition can also be applied in a thin layer to a Cu foil substrate (RCC—resin coated Cu) using slot-die or other related coating techniques.

The resins, prepregs and resin coated copper foil sheets described above can be used to make laminates, such as those used to manufacture printed circuit boards, in batch or in continuous processes. In exemplary continuous process for manufacturing laminates of this invention, a continuous sheet in the form of each of copper, a resin prepreg and a thin fabric sheet are continuously unwound into a series of drive rolls to form a layered web of fabric, adjacent to the resin prepreg sheet which is adjacent to a copper foil sheet such that the prepreg sheet lies between the copper foil sheet and the fabric sheet. The web is then subjected to heat and pressure conditions for a time that is sufficient to cause the resin to migrate into the fabric material and to completely cure the resin. In the resulting laminate, the migration of the resin material into the fabric causes the thickness of the resin layer (the distance between the copper foil material and the fabric sheet material to diminish and approach zero as combination layers discussed above transforms from a web of three layers into a single laminate sheet. In an alternative to this method, a single prepreg resin sheet can be applied to one side of the fabric material layer and the combination sandwiched between two copper layers after which heat and/or pressure is applied to the layup to cause the resin material to flow and thoroughly impregnate the fabric layer and cause both copper foil layers to adhere to the central laminate.

In still another embodiment, resin composition coated copper sheets can be made at the same time the laminate is being made by applying a thin coating of resin to two different continuously moving copper sheets, removing any excess resin from the sheets to control the resin thickness and then partially curing the resin under heat and/or pressure conditions to form a sheet of b-staged resin coated copper. The sheet(s) of b-staged resin coated copper can then be used directly in the laminate manufacturing process.

In yet another embodiment, the fabric material—with or without prior pretreatment—can be continuously fed into a resin composition bath such that the fabric material becomes impregnated with the resin composition. The resin composition can be optionally partially cured at this stage in the process. Next, one or two copper foil layers can be associated with the first and/or second planar surface of the resin composition impregnated fabric sheet to form a web after which heat and/or pressure is applied to the web to fully cure the resin composition.

The invention has been described in an illustrative manner. It is to be understood is that the terminology, which has been used, is intended to be in the nature of words of description rather than limitation. Many modifications and variations of the invention are possible in light of the above teachings. Therefore, within the scope of the appended claims, the invention may be practiced other than as specifically described.

What is claimed is:

1. A prepreg comprising:
    an at least partially cured resin impregnated reinforcing material portion having a dielectric constant $Dk_{WR}$, comprising reinforcing material and a resin, where the reinforcing material has a dielectric constant $Dk_R$ prior to the resin impregnation; and
    a free resin portion having a dielectric constant $Dk_W$,
    wherein the resin includes at least one high dielectric constant material, which is incorporated into the resin in an amount sufficient to match the $Dk_{WR}$ with the $Dk_W$ such that the $Dk_{WR}$ and $Dk_W$ differ by no more than (±) 15%, and wherein the dielectric constant $Dk_W$ and the dielectric constant $Dk_R$ differ by more than 15%.

2. The prepreg of claim 1 wherein the one or more high dielectric constant materials each have a Dk of at least 500.

3. The prepreg of claim 1 wherein the one or more high dielectric constant materials are particulate materials.

4. The prepreg of claim 3 wherein the one or more high dielectric constant material particle size ranges from about 1 nm to about 40 microns.

5. The prepreg of claim 1 wherein the one or more high dielectric constant materials are ferroelectric materials.

6. The prepreg of claim 5 wherein the ferroelectric materials are selected from the group consisting of strontium titanate, barium titanate, lead titanate, lead zirconate titanate, lead lanthanum zirconate titanate and combinations thereof.

7. The prepreg of claim 1 wherein the base resin is a thermoset or thermoplastic resin.

8. The prepreg of claim 1 wherein one or more high dielectric constant materials are present in the composition in an amount ranging from about 2 to about 70 wt %.

9. The prepreg of claim 1 wherein the reinforcing material is selected from the group consisting of woven glass fabric, paper, felt, glass fibers, and plastic sheets.

10. The prepreg of claim 9 wherein the reinforcing material is a low Dk woven glass fabric.

11. The prepreg of claim 10 wherein the low Dk woven glass fabric has a Dk ranging from about 3.5 to about 7.0.

12. The prepreg of claim 1 wherein the free resin is any resin that is at least 1 micron from any reinforcement surface.

13. The prepreg of claim 1 wherein the resin composition comprises at least one base resin and from about 5 to about 60 wt % of particles of the one or more high dielectric constant materials selected from the group consisting of strontium titanate, barium titanate, lead titanate, lead zirconate titanate, lead lanthanum zirconate titanate and combinations.

14. The prepreg of claim 1 wherein the $Dk_{WR}$ and $Dk_W$ differ by no more than (±) 5%.

15. The prepreg of claim 1 wherein the $Dk_R$ and the dielectric constant of the resin without the high dielectric constant material differ by more than 30%.

16. A laminate including a fully cured prepreg of claim 1.

17. The laminate of claim 16 including at least one copper layer.

18. A printed circuit board including as at least one layer, a fully cured prepreg of claim 1.

19. The prepreg of claim 1 wherein the free resin portion comprises any portion of the resin that is a distance of at least 1 micron from any top, bottom, or side surface of the reinforcing material.

20. A prepreg comprising:
    a reinforcing material having a $Dk_R$, and
    a resin composition comprising one or more base resins having a dielectric constant $Dk_W$, where $Dk_R$ is more than 15% greater than $Dk_W$, the resin composition further comprising one or more high dielectric constant materials in an amount sufficient to impart the resin composition with a cured dielectric constant $Dk_{WR}$ that matches the $Dk_R$ to which the resin composition is applied to within (±) 15%.

* * * * *